US01269032982

(12) United States Patent
Zhang et al.

(10) Patent No.: US 12,690,329 B2
(45) Date of Patent: Jul. 21, 2026

(54) DISPLAY PANEL, DISPLAY DEVICE AND METHOD FOR MANUFACTURING DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Jiazhao Zhang, Shenzhen (CN); Jian Wu, Shenzhen (CN); Qi Ouyang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 688 days.

(21) Appl. No.: 17/758,072

(22) PCT Filed: May 10, 2022

(86) PCT No.: PCT/CN2022/091840
§ 371 (c)(1),
(2) Date: Jun. 28, 2022

(87) PCT Pub. No.: WO2023/197386
PCT Pub. Date: Oct. 19, 2023

(65) Prior Publication Data
US 2024/0188332 A1 Jun. 6, 2024

(30) Foreign Application Priority Data
Apr. 11, 2022 (CN) ......................... 202210374932.7

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/873* (2023.02); *H10K 71/135* (2023.02); *H10K 71/60* (2023.02)

(58) Field of Classification Search
CPC ............. H10K 59/122; H10K 59/1201; H10K 59/873; H10K 71/60; H10K 71/135
(Continued)

(56) References Cited

U.S. PATENT DOCUMENTS

2004/0028807 A1* 2/2004 Yamazaki .............. H10K 50/17
427/66
2004/0253756 A1* 12/2004 Cok ..................... H10K 50/824
438/22
(Continued)

FOREIGN PATENT DOCUMENTS

CN 103066212 A 4/2013
CN 106206646 A 12/2016
(Continued)

OTHER PUBLICATIONS

Chinese Office Action issued in corresponding Chinese Patent Application No. 202210374932.7 dated Aug. 31, 2024, pp. 1-7.
(Continued)

*Primary Examiner* — Dzung Tran
(74) *Attorney, Agent, or Firm* — PV IP PC; Wei Te Chung

(57) ABSTRACT

Embodiments of the present disclosure disclose a display panel, a display device, and a method for manufacturing the display panel. The display panel includes an array substrate, an anode layer, a pixel definition layer, a fence layer, and a
(Continued)

cathode layer. The array substrate includes an lap layer, and the lap layer includes a lap portion. A first opening on the anode layer exposes the lap portion. The fence layer includes a fence portion, and the fence layer includes a fence portion extending along an edge of the second opening. In the present disclosure, lap effect between the cathode layer and the lap portion can be improved by setting the fence portion.

20 Claims, 6 Drawing Sheets

(51) Int. Cl.
*H10K 59/80* (2023.01)
*H10K 71/13* (2023.01)
*H10K 71/60* (2023.01)
(58) Field of Classification Search
USPC ........................................................ 257/40
See application file for complete search history.

(56) References Cited

U.S. PATENT DOCUMENTS

| | | | | |
|---|---|---|---|---|
| 2008/0246403 | A1* | 10/2008 | Sagawa | G09G 3/3266 445/47 |
| 2010/0102335 | A1* | 4/2010 | Takagi | H10K 50/824 257/40 |
| 2011/0108842 | A1* | 5/2011 | Yamazaki | H10H 29/142 257/E33.053 |
| 2013/0056784 | A1* | 3/2013 | Lee | H10K 59/1315 438/22 |
| 2014/0346459 | A1 | 11/2014 | Song et al. | |
| 2019/0288047 | A1* | 9/2019 | Jeong | H10K 59/124 |
| 2019/0326376 | A1* | 10/2019 | Huo | H10K 59/80522 |

FOREIGN PATENT DOCUMENTS

| | | | |
|---|---|---|---|
| CN | 107039491 | A | 8/2017 |
| CN | 107331691 | A | 11/2017 |
| CN | 107565048 | A | 1/2018 |
| CN | 107611283 | A | 1/2018 |
| CN | 108010943 | A | 5/2018 |
| CN | 109560117 | A | 4/2019 |
| CN | 109713162 | A | 5/2019 |
| CN | 111029376 | A | 4/2020 |
| CN | 111916578 | A | 11/2020 |
| CN | 112103326 | A | 12/2020 |
| CN | 112289946 | A | 1/2021 |
| CN | 113327937 | A | 8/2021 |
| CN | 113629115 | A | 11/2021 |
| KR | 20150002422 | A | 1/2015 |

OTHER PUBLICATIONS

International Search Report in International application No. PCT/CN2022/091840, mailed on Dec. 19, 2022.
Written Opinion of the International Search Authority in International application No. PCT/CN2022/091840,mailed on Dec. 20, 2022.

* cited by examiner

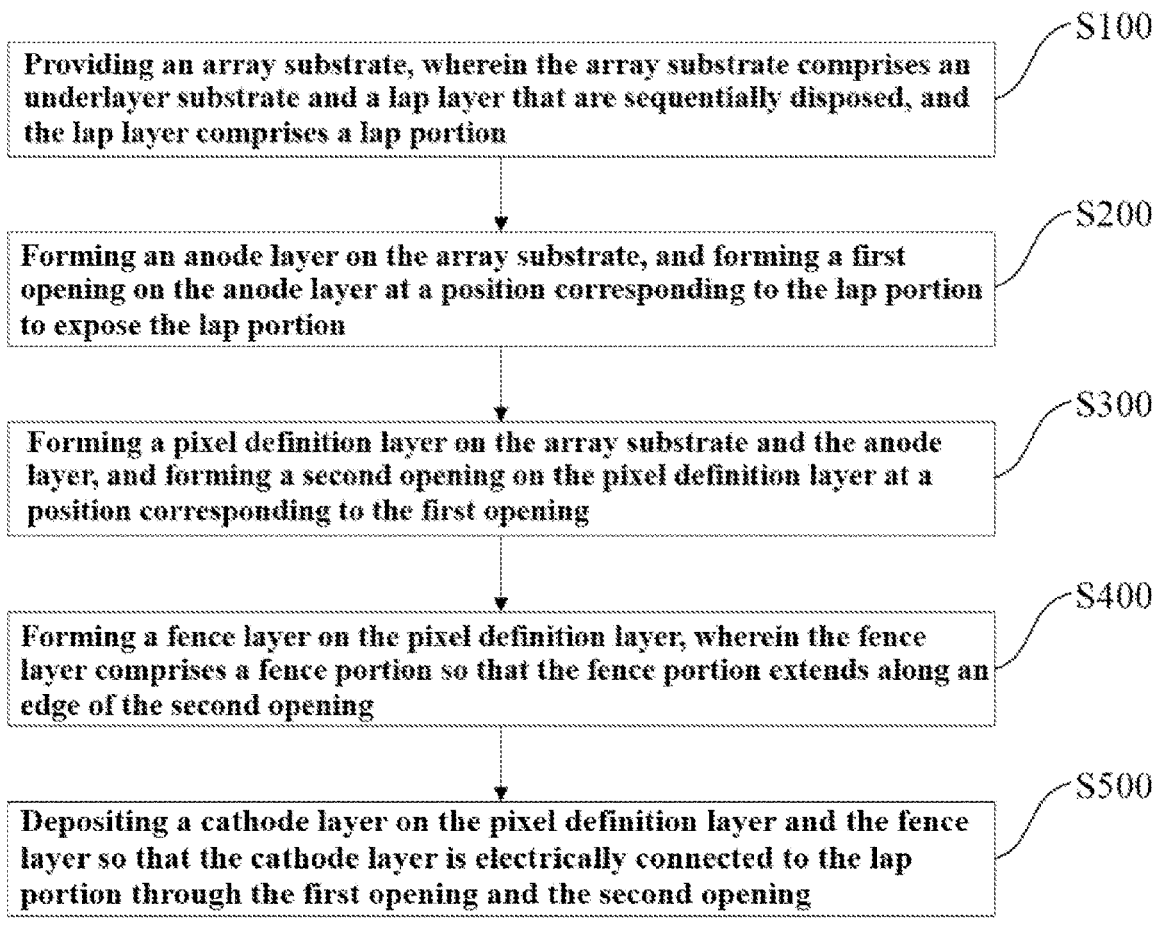

Providing an array substrate, wherein the array substrate comprises an underlayer substrate and a lap layer that are sequentially disposed, and the lap layer comprises a lap portion ⟋S100

Forming an anode layer on the array substrate, and forming a first opening on the anode layer at a position corresponding to the lap portion to expose the lap portion ⟋S200

Forming a pixel definition layer on the array substrate and the anode layer, and forming a second opening on the pixel definition layer at a position corresponding to the first opening ⟋S300

Forming a fence layer on the pixel definition layer, wherein the fence layer comprises a fence portion so that the fence portion extends along an edge of the second opening ⟋S400

Depositing a cathode layer on the pixel definition layer and the fence layer so that the cathode layer is electrically connected to the lap portion through the first opening and the second opening ⟋S500

FIG. 4

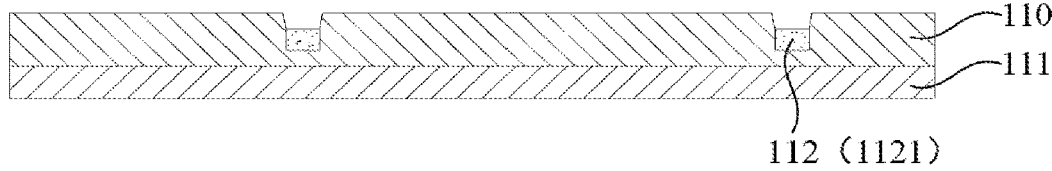

FIG. 5

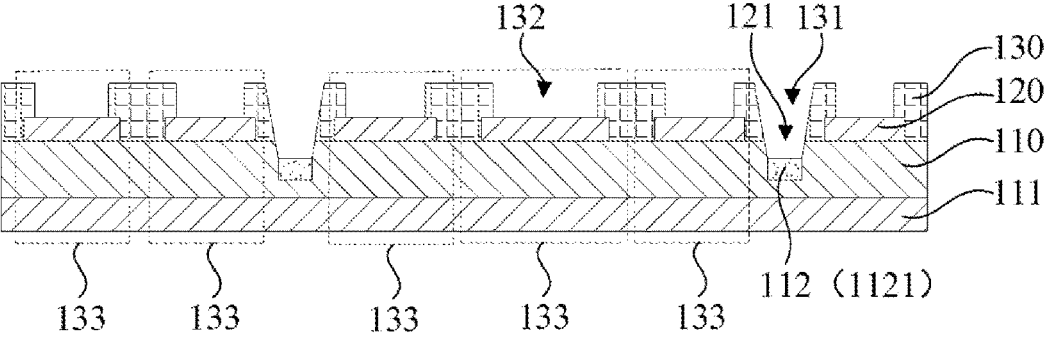

FIG. 6

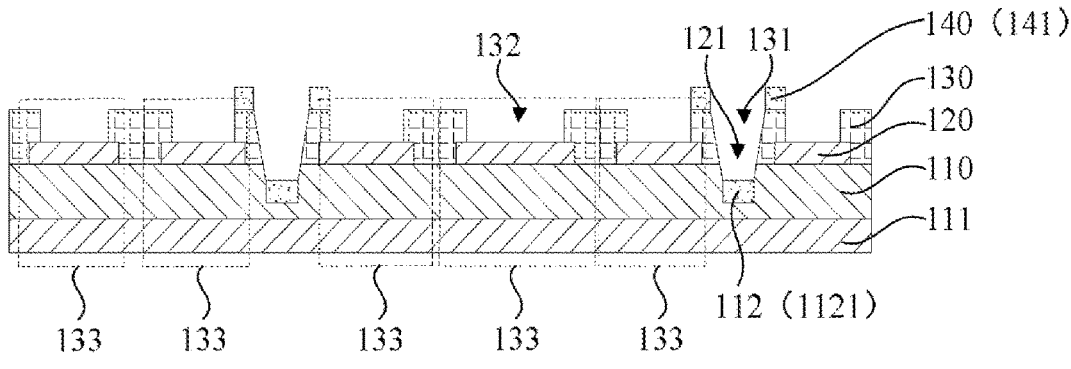
FIG. 7
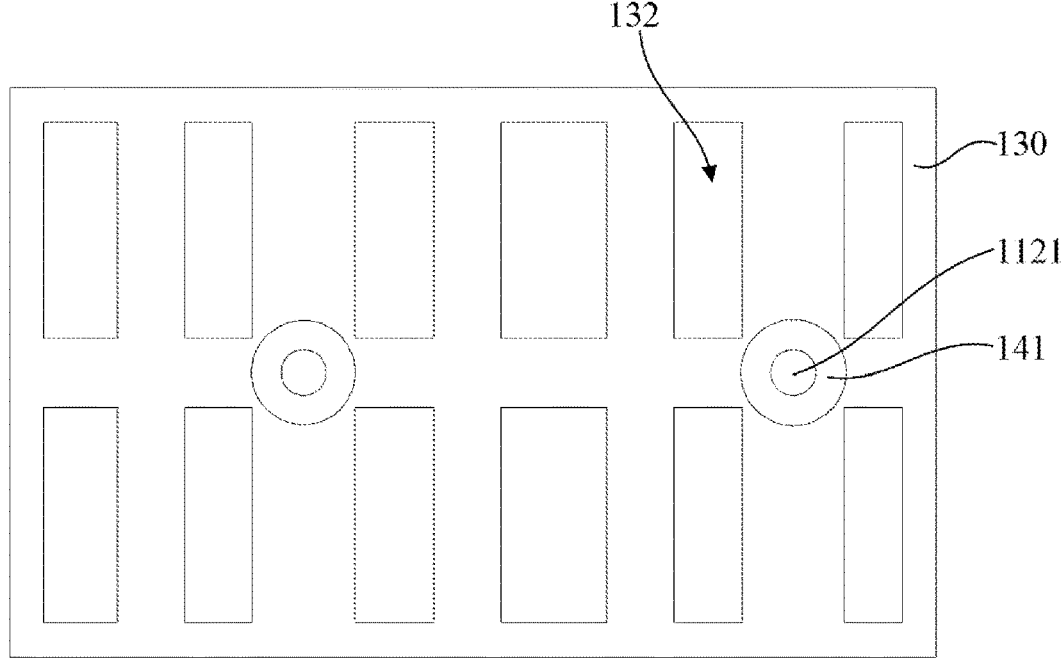
FIG. 8
FIG. 9

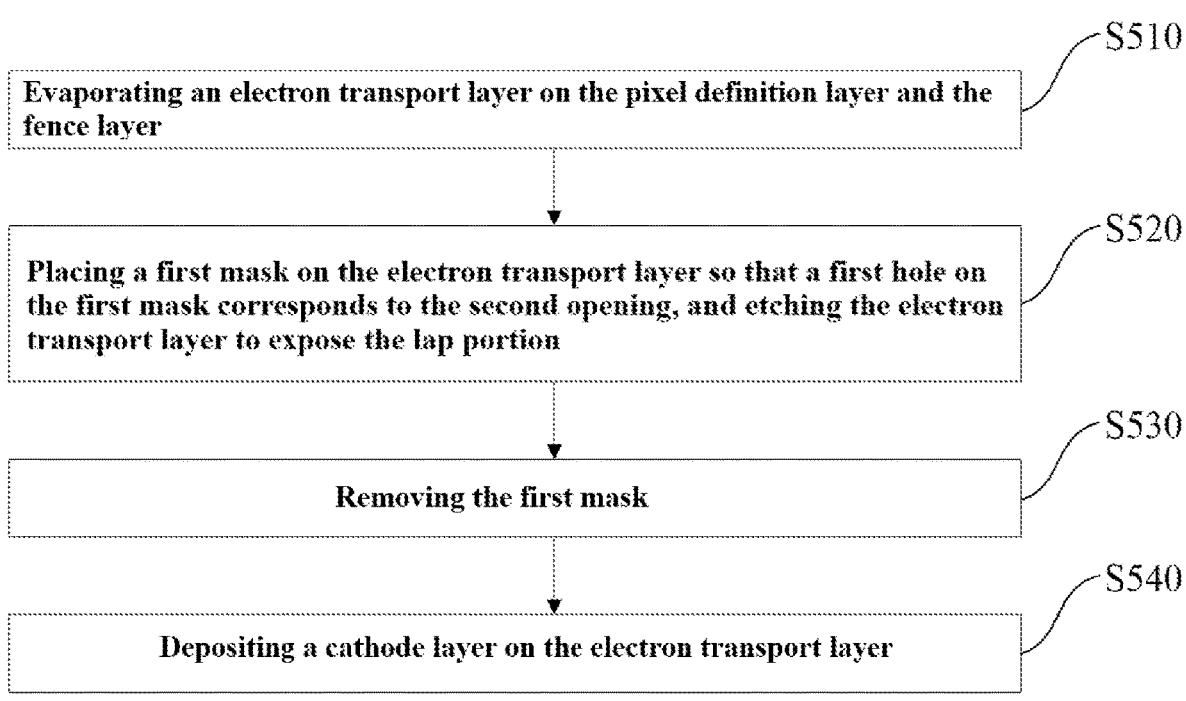

S510

Evaporating an electron transport layer on the pixel definition layer and the fence layer

S520

Placing a first mask on the electron transport layer so that a first hole on the first mask corresponds to the second opening, and etching the electron transport layer to expose the lap portion

S530

Removing the first mask

S540

Depositing a cathode layer on the electron transport layer

FIG. 10

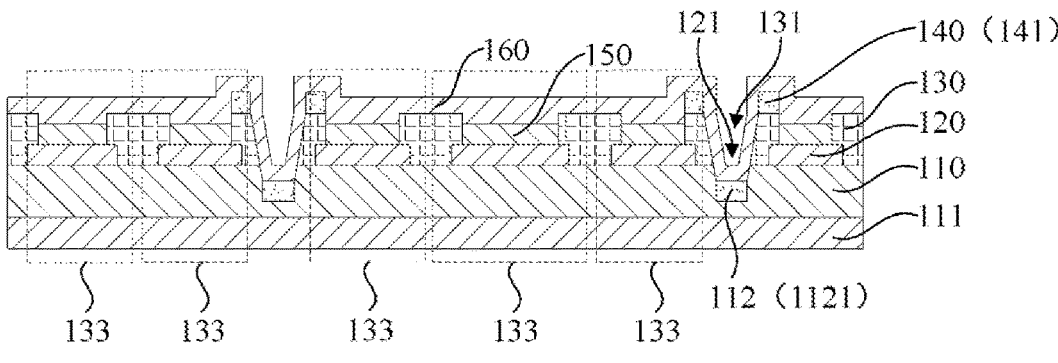

FIG. 11

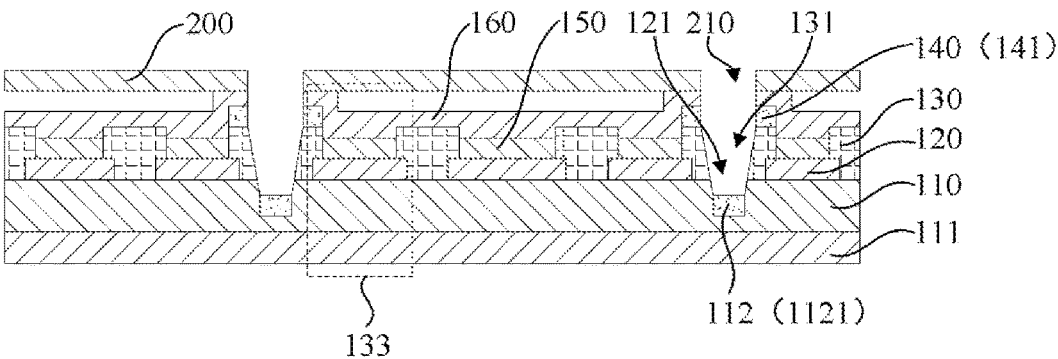

FIG. 12

Placing a second mask on the electron transport layer so that a second hole on the second mask corresponds to the second opening and a third hole on the second mask corresponds to the pixel opening　　S541

Depositing a cathode layer on the second mask at a position corresponding to the second hole and the third hole　　S542

Removing the second mask　　S543

100

100

DISPLAY PANEL, DISPLAY DEVICE AND METHOD FOR MANUFACTURING DISPLAY PANEL

TECHNICAL FIELD

The present disclosure relates to a technical field of display, and in particular, to a display panel, a display device, and a method for manufacturing a display panel.

BACKGROUND

With the rapid development of display panels, a great demand for large-size display panels is increasing, but a large-size display panel operates with internal resistance voltage drop at different positions in a display area of the display panel, resulting in uneven display of the display panel as a whole. For this reason, currently, a lap layer is often provided in an array substrate of a display panel to serve as an auxiliary electrode, and an undercut is formed at a corresponding position on the lap layer, then a cathode layer and the lap layer are connected to provide an additional assistance to areas with large voltage drop, so that a display of an image is uniform and stable when the whole display panel is in operation. However, in the prior art, the lap mode between a cathode layer and the lap layer is complex and a lap effect is poor, resulting in a complicated process for manufacturing display panels and low production yields.

Technical Problem

Embodiments of the present disclosure provide a display panel, a display device, and a method for manufacturing a display panel, which can solve problems in the prior art that a lap mode of a cathode layer and a lap layer in an array substrate is complex and the lap effect is poor.

Technical Solution

Embodiments of the present disclosure provide a display panel, comprising: an array substrate comprising an underlayer substrate and a lap layer that are sequentially disposed, wherein the lap layer comprises a lap portion;

an anode layer disposed on the array substrate, wherein a first opening is formed on the anode layer at a position corresponding to the lap portion, and the first opening exposes the lap portion;

a pixel definition layer disposed on the array substrate and the anode layer, and a second opening is formed on the pixel definition layer at a position corresponding to the first opening;

a fence layer disposed on the pixel definition layer, and the fence layer comprises a fence portion extending along an edge of the second opening; and a cathode layer disposed on the pixel definition layer and the fence layer, and the cathode layer is electrically connected to the lap portion through the first opening and the second opening.

Optionally, in some embodiments of the present disclosure, the fence portion extends in an annular shape along an edge of the second opening.

Optionally, in some embodiments of the present disclosure, the fence portion has a circular structure; the fence portion has an inner diameter of greater than or equal to 6 microns and less than or equal to 12 microns; and a difference between an outer diameter and the inner diameter of the fence portion is greater than or equal to 7 microns and less than or equal to 12 microns.

Optionally, in some embodiments of the present disclosure, the fence portion has a thickness of greater than or equal to 0.8 microns and less than or equal to 2 microns.

Optionally, in some embodiments of the present disclosure, the display panel comprises a plurality of pixel regions, a pixel opening is formed in the pixel definition layer at a position corresponding to the pixel regions, and the pixel opening exposes a part of the anode layer; and the lap portion is disposed between at least two adjacent said pixel regions.

Optionally, in some embodiments of the present disclosure, the display panel further comprises a light-emitting layer and an electron transport layer, the light-emitting layer is disposed on the anode layer, the light-emitting layer is located within the pixel opening, and the electron transport layer is located on the light-emitting layer and the pixel definition layer.

Optionally, in some embodiments of the present disclosure, the lap layer comprises a plurality of the lap portions; a spacing between the two adjacent lap portions is greater than or equal to 10 mm and less than or equal to 100 mm.

Optionally, in some embodiments of the present disclosure, the spacing between two adjacent said lap portions is an integer multiple of a width of the pixel region in a layout direction of the plurality of lap portions.

Optionally, in some embodiments of the present disclosure, a material of the lap layer comprises copper, aluminum, silver, or a metal alloy.

Optionally, in some embodiments of the present disclosure, the array substrate comprises a thin film transistor layer comprising a gate layer and a source/drain layer; the lap layer and the gate layer are disposed in the same layer; or the lap layer and the source/drain layer are disposed in the same layer.

Optionally, in some embodiments of the present disclosure, a height of the light-emitting layer away from the array substrate relative to the array substrate is less than a height of the fence layer away from the array substrate relative to the array substrate.

Optionally, in some embodiments of the present disclosure, the display panel further comprises an encapsulation layer disposed on the cathode layer, and the encapsulation layer fills the first opening and the second opening.

Accordingly, embodiments of the present disclosure further provide a display device, comprising:

the display panel according to the above embodiments;

a housing connected to the display panel; and a control circuit disposed in the housing, and the control circuit is electrically connected to the display panel.

Accordingly, embodiments of the present disclosure further provide a method for manufacturing a display panel, comprising steps as follows:

providing an array substrate, the array substrate comprises an underlayer substrate and a lap layer that are sequentially disposed, and the lap layer comprises a lap portion;

forming an anode layer on the array substrate, and forming a first opening on the anode layer at a position corresponding to the lap portion to expose the lap portion;

forming a pixel definition layer on the array substrate and the anode layer, and forming a second opening on the pixel definition layer at a position corresponding to the first opening;

forming a fence layer on the pixel definition layer, and the fence layer comprises a fence portion so that the fence portion extends along an edge of the second opening; and depositing a cathode layer on the pixel definition layer and the fence layer so that the cathode layer is electrically connected to the lap portion through the first opening and the second opening.

Optionally, in some embodiments of the present disclosure, said depositing a cathode layer on the pixel definition layer and the fence layer comprises steps as follows:

evaporating an electron transport layer on the pixel definition layer and the fence layer;

placing a first mask on the electron transport layer so that a first hole on the first mask corresponds to the second opening, and etching the electron transport layer to expose the lap portion;

removing the first mask; and depositing a cathode layer on the electron transport layer.

Optionally, in some embodiments of the present disclosure, the number of the first holes is less than or equal to a number of the lap portions.

Optionally, in some embodiments of the present disclosure, a diameter of the first hole is smaller than an outer diameter of the fence portion.

Optionally, in some embodiments of the present disclosure, said step of evaporating an electron transport layer on the pixel definition layer and the fence layer comprises steps as follows:

forming a plurality of pixel openings on the pixel definition layer so as to expose part of the anode layer;

printing a light-emitting layer on the anode layer so that the light-emitting layer is located in the pixel opening; and evaporating an electron transport layer on the light-emitting layer, the pixel definition layer, and the fence layer.

Optionally, in some embodiments of the present disclosure, said step of depositing a cathode layer on the electron transport layer comprises steps as follows:

placing a second mask on the electron transport layer so that a second hole on the second mask corresponds to the second opening and a third hole on the second mask corresponds to the pixel opening;

depositing a cathode layer on the second mask at a position corresponding to the second hole and the third hole; and removing the second mask.

Optionally, in some embodiments of the present disclosure, the method further comprises:

forming an encapsulation layer on the cathode layer so that the encapsulation layer fills the first opening and the second opening.

Technical Effect

In the embodiments of the present disclosure, the display panel comprises an array substrate, an anode layer, a pixel definition layer, a fence layer, and a cathode layer, wherein the array substrate comprises an underlayer substrate and a lap layer that are sequentially disposed, and the lap layer comprises a lap portion; the anode layer is disposed on the array substrate, a first opening is formed on the anode layer at a position corresponding to the lap portion to expose the lap portion; the pixel definition layer is disposed on the array substrate and the anode layer, and a second opening is formed on the pixel definition layer at a position corresponding to the first opening; the fence layer is disposed on the pixel definition layer, and the fence layer comprises a fence portion extending along an edge of the second opening; the cathode layer is disposed on the pixel definition layer and the fence layer, and the cathode layer is electrically connected to the lap portion through the first opening and the second opening. Since the fence portion is disposed on the pixel definition layer, and the fence portion extends along an edge of the second opening, the fence portion can play a role of supporting and protecting in the process of manufacturing the display panel, which is convenient for the exposure of the lap portion and effective electrical connection between the cathode layer and the lap portion. Meanwhile, a risk that areas outside the fence portion 141 being etched can be reduced, and the lap effect between the cathode layer and the lap portion can be improved.

BRIEF DESCRIPTION OF THE DRAWINGS

In order to more clearly describe the technical solutions in embodiments of the present disclosure, the appended drawings used for describing the embodiments will be briefly introduced hereinafter. Apparently, the appended drawings described below are only directed to some embodiments of the present disclosure, and for a person skilled in the art, without expenditure of creative labor, other drawings can be derived on the basis of these appended drawings.

FIG. 4 is a flowchart of a method for manufacturing a display panel according to an embodiment of the present disclosure;

FIG. 5 is a schematic structural diagram of step S100 in FIG. 4 according to an embodiment of the present disclosure;

FIG. 6 is a schematic structural diagram of step S300 in FIG. 4 according to an embodiment of the present disclosure;

FIG. 7 is is a schematic structural diagram of step S400 in FIG. 4 according to an embodiment of the present disclosure;

FIG. 8 is a top view of structure of step S400 in FIG. 4 according to an embodiment of the present disclosure;

FIG. 9 is a schematic structural diagram of step S500 in FIG. 4 according to an embodiment of the present disclosure;

FIG. 10 is a flowchart of step S500 in FIG. 4 according to an embodiment of the present disclosure;

FIG. 11 is a schematic structural diagram of step S510 in FIG. 10 according to an embodiment of the present disclosure;

FIG. 12 is a schematic structural diagram of step S520 in FIG. 10 according to an embodiment of the present disclosure;

DESCRIPTION OF REFERENCE NUMBERS

Figure 1:
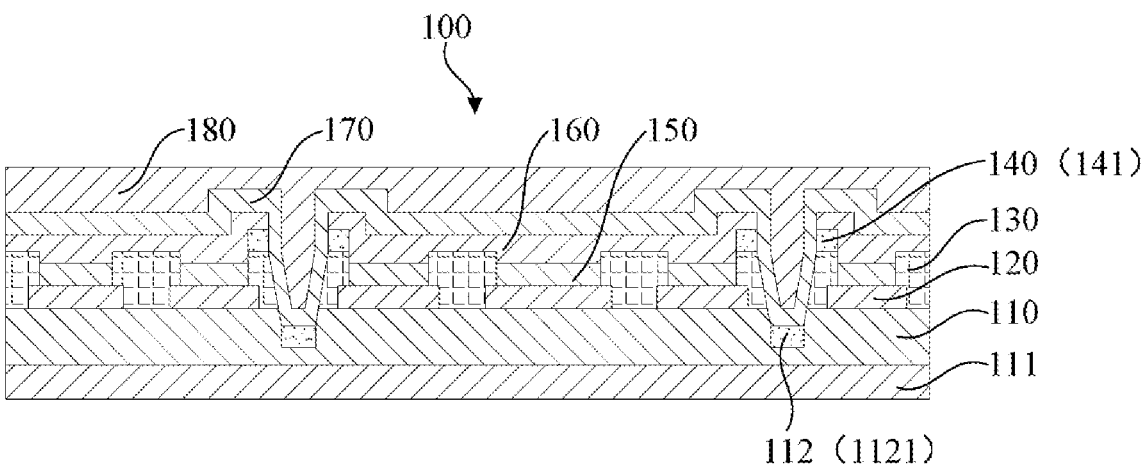
FIG. 1 is a schematic structural diagram of a display panel according to an embodiment of the present disclosure.

| Reference number | Component name | Reference number | Component name |
|---|---|---|---|
| 10 | Display device | 141 | Fence portion |
| 100 | Display panel | 150 | Light-emitting layer |
| 110 | Array substrate | 160 | Electron transport layer |
| 111 | Underlayer substrate | 170 | Cathode layer |
| 112 | Lap Layer | 180 | Encapsulation layer |
| 1121 | Lap portion | 200 | First mask |
| 120 | Anode layer | 210 | First hole |
| 121 | First opening | 300 | Second mask |
| 130 | Pixel definition layer | 310 | Second hole |
| 131 | Second opening | 320 | Third hole |
| 132 | Pixel opening | 400 | Control circuit |
| 133 | Pixel region | 500 | Housing |
| 140 | Fence Layer | | |

DETAILED DESCRIPTION

Hereinafter, technical solutions in embodiments of the present disclosure will be clearly and completely described with reference to the accompanying drawings in embodiments of the present disclosure. Apparently, the described embodiments are part of, not all of, the embodiments of the present disclosure. All the other embodiments, obtained by a person with ordinary skill in the art on the basis of the embodiments in the present disclosure without expenditure of creative labor, belong to the protection scope of the present disclosure. In addition, it should be understood that specific embodiments described herein are only used to illustrate and explain the present disclosure, and are not intended to limit the present disclosure. In the present disclosure, unless otherwise stated, orientation words such as "up" and "down" generally refers to "up" and "down" in the actual use or working state of a device, and specifically refers to the drawing direction in the drawings; while "inside" and "outside" refer to outline of a device.

Embodiments of the present disclosure provide a display panel, a display device, and a method for manufacturing a display panel. Details are described below. It should be noted that the order of describing the following embodiments is not taken as a limitation on the preferred order of the embodiments.

Figure 2:
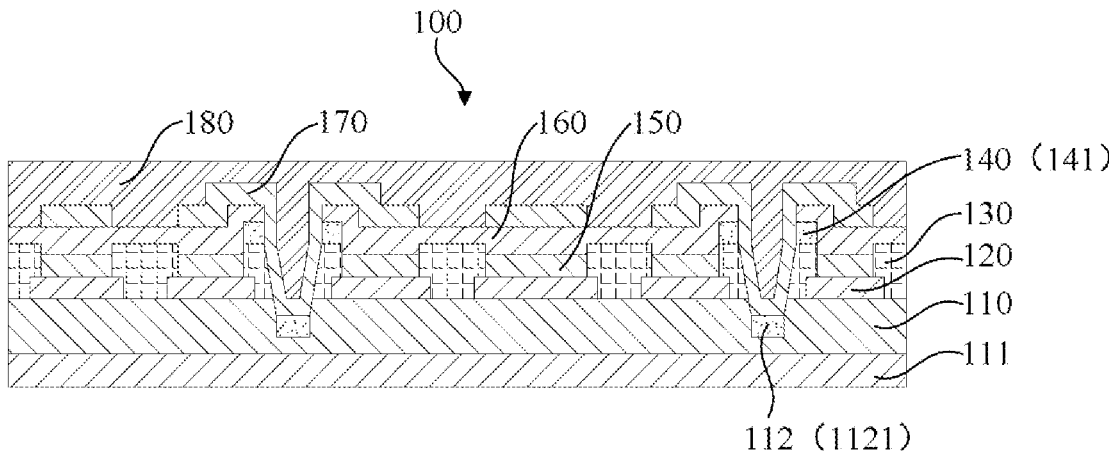
FIG. 2 is a schematic structural diagram of another display panel according to an embodiment of the present disclosure.

Firstly, an embodiment of the present disclosure provides a display panel. As shown in FIGS. 1 and 2, a display panel 100 comprises an array substrate 110, and the array substrate 110 comprises an underlayer substrate 111 and a lap layer 112 that are sequentially disposed. The underlayer substrate 111 serves as a supporting structure of the display panel 100, and is used to support other film layer structures of the display panel 100, so as to ensure stability of structure of the display panel 100. The lap layer 112 is used for electrical connection with other film layers on the array substrate 110.

By designing the structure of the lap layer 112, requirements for lapping different display panel 100 can be met.

The lap layer 112 comprises a lap portion 1121. During a manufacturing process of the display panel 100, film layers over the lap portion 1121 in the array substrate 110 will be punched to expose the lap portion 1121, thereby facilitating electrical connection between other film layers above the array substrate 110 and the lap portion 1121. Through matching design of a position of the lap portion 1121 and a punching position, other film layers above the array substrate 110 can be electrically connected to different positions in the array substrate 110 to meet different lap requirements.

It should be noted that, since the lap layer 112 is used for electrical connection with other film layers above the array substrate 110, and a lap resistance will be formed, in order to avoid excessive lap resistance between other film layers and the lap layer 112, thus affecting display effect of the display panel 100, materials of the lap layer 112 can be selected from low-resistance metal materials, such as copper, aluminum, silver and other metals or metal alloys.

The array substrate 110 is provided with a thin film transistor layer TFT, which comprises a plurality of metal layers, such as a gate layer 113 and a source/drain layer 114. During the manufacturing process of the display panel 100, in order to reduce manufacturing process of each film layer, the lap layer 112 and the metal layer in the thin film transistor may be disposed in the same layer, for example, the lap layer 112 and the gate layer 113 may be disposed in the same layer, or the lap layer 112 and the source/drain layer 114 may be disposed in the same layer. This structural design enables fabrication of the lap layer 112 to be completed at the same time of fabricating the thin film transistor layer, thus simplifying the fabrication process.

It should be noted that the lap layer 112 can also be disposed on other film layers of the array substrate 110, so that the lap layer 112 is as close as possible to one side of the array substrate 110 away from the substrate 111, thereby reducing punching depth of the film layers above the lap portion 1121 in the array substrate 110, so as to facilitate connection of other film layers above the array substrate 110 and the lap portion 1121, improve the lap effect, and meanwhile facilitate subsequent encapsulation of the display panel 100.

The display panel 100 comprises an anode layer 120 disposed on the array substrate 110. During the manufacturing process, the anode layer 120 is electrically connected to the thin film transistor in the thin film transistor layer, and on and off of the anode layer 120 are controlled by switching actions of the thin film transistor, so as to regulate a light-emitting function of a light-emitting functional layer on the anode layer 120, thereby realizing display control of the display panel 100.

As shown in FIG. 6, a first opening 121 is formed on the anode layer 120 at a position corresponding to the lap portion 1121, and the first opening 121 exposes the lap portion 1121, so as to facilitate electrical connection between subsequent film layers and the lap portion 1121. The size of the first opening 121 can be adjusted according to the size of an exposed area of the lap portion 1121, and it is necessary to ensure that the subsequent film layers can be effectively connected to the lap portion 1121 through the first opening 121.

The display panel 100 comprises a pixel definition layer 130 disposed on the array substrate 110 and the anode layer 120. The pixel definition layer 130 is used to define positions of pixels in the display panel 100, so as to regulate the distribution of the light-emitting areas in the display panel 100, thereby realizing the regulation of display effect of the display panel 100. A second opening 131 is formed on the pixel definition layer 130 at a position corresponding to the first opening 121, so that the second opening 131 communicates with the first opening 121, thereby ensuring that the subsequent film layers can be electrically connected to the lap portion 1121 through the first opening 121 and the second opening 131.

As shown in FIG. 7, the display panel 100 comprises a fence layer 140 disposed on the pixel definition layer 130. The fence layer 140 comprises a fence portion 141 extending along an edge of the second opening 131, that is, a fence portion 141 is convexly disposed on the pixel definition layer 130 along an edge of the second opening 131 of the pixel definition layer 130. Since the second opening 131 and the first opening 121 communicate with each other and expose the lap portion 1121, when other films are evaporated on the pixel definition layer 130, the lap portion 1121 will be covered. In the process of manufacturing the display panel 100, the fence portion 141 can support a shielding structure, so that film layers covered on the lap portion 1121 can be removed to expose the lap portion 1121, which facilitates lap of other film layers with the lap portion 1121, and meanwhile prevent the shielding structure from scratching related films of the display panel 100. In addition, the fence portion 141 can reduce the risk that areas outside the fence portion 141 are etched, thereby improving display effect of the display panel 100.

As shown in FIG. 9, the display panel 100 comprises a cathode layer 170 disposed on the pixel definition layer 130 and the fence layer 140. The cathode layer 170 and the anode layer 120 are connected to an external circuit through metal traces on the display panel 100 to realize on and off of a circuit, so as to control the light emission of the light-emitting functional layer between the cathode layer 170 and the anode layer 120, thereby realizing the regulation of the display of the display panel 100.

The cathode layer 170 is electrically connected to the lap portion 1121 through the first opening 121 and the second opening 131. When the display panel 100 is in operation, due to the influence of an internal resistances of the cathode layer 170 and the metal traces, there are internal resistance voltage drops at different positions in display area of the display panel 100, which may easily cause uneven display of the display panel 100 as a whole. A resistor with a small resistance value will be formed at a position of the cathode layer 170 corresponding to the lap portion 1121 by electrically connecting the cathode layer 170 and the lap portion 1121 in parallel, so as to achieve the purpose of reducing internal resistance voltage drops in corresponding area of the display panel 100, thereby improving the overall display effect of the display panel 100.

It should be noted that internal resistance voltage drops at different positions in display areas of the display panel 100 are different, and positions of the lap portions 1121 in the lap layer 112 can be adjusted according to actual internal resistance voltage drops at different positions in the display area, so that the lap portions 1121 are mainly disposed at positions where internal resistance voltage drops are large, so as to balance internal resistance voltage drops at different positions in the display area and ensure display uniformity of the display panel 100.

In embodiments of the present disclosure, the display panel 100 comprises an array substrate 110, an anode layer 120, a pixel definition layer 130, a fence layer 140, and a cathode layer 170 that are sequentially disposed. The array substrate 110 comprises an underlayer substrate 111 and a lap layer 112 that are sequentially disposed. The lap layer 112 comprises a lap portion 1121. The first opening 121 is formed on the anode layer 120 to expose the lap portion 1121. The second opening 131 is formed on the pixel definition layer 130 at a position corresponding to the first opening 121. The fence layer 140 comprises a fence portion 141 extending along an edge of the second opening 131. The cathode layer 170 is electrically connected to the lap portion 1121 through the first opening 121 and the second opening 131. Since the fence portion 141 is disposed on the pixel definition layer 130, and the fence portion 141 extends along an edge of the second opening 131, the fence portion 141 can play a role of supporting and protecting in the process of manufacturing the display panel 100, which is convenient for exposing the lap portion 1121 and effective electrical connection between the cathode layer 170 and the lap portion 1121. Risk of areas outside the fence portion 141 being etched can also be reduced, and lap effect between the cathode layer 170 and the lap portion 1121 can be improved.

Optionally, the fence portion 141 on the pixel definition layer 130 extends in an annular shape along an edge of the second opening 131, i.e., the fence portion 141 surrounds an edge of the second opening 131. In the process of manufacturing the display panel 100, when it is necessary to remove film layers located in the first opening 121 and the second opening 131 and covering the lap portion 1121, a contact surface between the fence portion 141 and a shielding structure placed on the fence portion 141 is annular, which is helpful to improve the stability of the shielding structure.

In addition, the fence portion 141 is set as a circular structure so that when plasma etching gas is used to etch film layers located in the first opening 121 and the second opening 131 and covering the lap portion 1121, the fence portion 141 can play a protective role, and further prevent structure other than the fence portion 141 from being etched by plasma etching gas, thereby ensuring the structural integrity of the display panel 100 and improving the display effect of the display panel 100.

Optionally, the fence portion 141 has a circular structure. Since the first opening 121 and the second opening 131 are mostly circular structures when punching holes above the lap portion 1121, utilization rate of the fence portion 141 can be improved when the fence portion 141 has a circular structure. Meanwhile, the design of a circular structure can avoid stress concentration on the fence layer 140, and risk of cracking of the fence portion 141 due to stress concentration during use of the display panel 100, especially during use of the flexible panel, thereby ensuring stable application of the display panel 100.

It should be noted that, in addition to a circular structure, the fence portion 141 can also be designed as a square ring, an elliptical ring or other annular structure, and its specific shape can be adjusted according to the shape of the second opening 131 and actual application situation, and it is necessary to ensure that the fence portion 141 can play an effective supporting role and effectively protect areas other than the fence portion 141, which is not specially limited herein.

Optionally, the fence portion 141 has an inner diameter of greater than or equal to 6 microns and less than or equal to 12 microns. If the inner diameter of the fence portion 141 is too large, in the process of removing film layers located in the first opening 121 and the second opening 131 and covering the lap portion 1121, the whole area within the fence portion 141 is within an action range of plasma etching gas, and light-emitting area of the display panel 100 needs to be set outside the fence portion 141, so that spacing between the light-emitting area and the lap portion 1121 is large, resulting in an increase in the overall size of the display panel 100, which is not conducive to installation and use of the display panel 100. If the inner diameter of the fence portion 141 is too small, size of the corresponding second opening 131 will be small, resulting in a small exposed area of the lap portion 1121, which is not conducive to lap of the cathode layer 170 and the lap portion 1121.

During actual manufacturing process, the inner diameter of the fence portion 141 is set as 6 micron, 8 micron, 10 micron or 12 micron, which can not only avoid that area within the fence portion 141 is too large to cause the overall size of the display panel 100 to be too large, but also avoid that area within the fence portion 141 is too small to cause exposed area of the lap portion 1121 to be too small, thus ensuring effective electrical connection between the cathode layer 170 and the lap portion 1121. Specific inner diameter value can be adjusted according to size of the second opening 131 and actual lap demand of the cathode layer 170 and the lap portion 1121, which is not specially limited herein.

Optionally, a difference between an outer diameter and the inner diameter of the fence portion 141 is greater than or equal to 7 microns and less than or equal to 12 microns. The fence portion 141 is disposed on the pixel definition layer 130. In order to ensure normal display of the display panel 100, the fence portion 141 cannot shield the corresponding light-emitting area on the pixel definition layer 130. If a difference between the outer diameter and the inner diameter of the fence portion 141 is too large, that is, an annular width of the fence portion 141 is too large, spacing between the light-emitting area and the lap portion 1121 will increase, thereby causing the overall size of the display panel 100 to increase. If a difference between the outer diameter and the inner diameter of the fence portion 141 is too small, contact area between the fence portion 141 and the shielding structure placed on the fence portion 141 will be too small, which is not conducive to stability of the shielding structure, but also leads to low structural strength of the fence portion 141 itself.

During actual manufacturing process, a difference between the outer diameter and the inner diameter of the fence portion 141 is set as 7 micron, 8 micron, 10 micron or 12 micron, etc., which can not only avoid that annular width of the fence portion 141 is too large to cause the overall size of the display panel 100 to be too large, but also ensure that the fence portion 141 has sufficient structural strength to improve the overall structural stability of the display panel 100. Specific difference can be adjusted according to setting of the light-emitting area of the display panel 100 and actual design requirements, which is not specially limited herein.

Optionally, the fence portion 141 has a thickness of greater than or equal to 0.8 microns and less than or equal to 2 microns. If thickness of the fence portion 141 is too large, the overall thickness of the display panel 100 will be too large, resulting in an increase in weight of the display panel 100, which is not conducive to installation and use of the display panel 100. If thickness of the fence portion 141 is too small, the fence portion 141 will fail to play obvious supporting role, and even the shielding structure placed on the fence portion 141 will scratche surface film during manufacturing process of the display panel 100, which will affect display effect of the display panel 100.

During actual manufacturing process, thickness of the fence portion 141 is set as 0.8 micron, 1 micron, 1.2 micron, 1.5 micron, 1.8 micron or 2 micron, etc., which can not only ensure effective support of the fence portion 141 for the shielding structure placed on the fence portion 141, but also avoid that thickness of the fence portion 141 is too large to cause the overall thickness of the display panel 100 to be too large. Specific thickness of the fence portion 141 can be adjusted according to actual design requirements, which is not specially limited herein.

Optionally, as shown in FIG. 7, the display panel 100 comprises a plurality of pixel regions 133, a pixel opening 132 is formed on the pixel definition layer 130 at a position corresponding to the pixel regions 133, and the pixel opening 132 exposes part of the anode layer 120, so as to facilitate connection between subsequent light-emitting function layer and the anode layer 120. Each pixel region 133 is correspondingly provided with a light-emitting pixel, and light-emitting effect of the pixel region 133 can be adjusted through coordination design of light-emitting pixels of different colors, so as to meet different display requirements of the display panel 100.

It should be noted that one pixel region 133 comprises only one type of light-emitting pixel, that is, one pixel region 133 corresponds to one type of light-emitting color. Alternatively, one pixel region 133 comprises a plurality of light-emitting pixels, and types of the plurality of light-emitting pixels can be the same or different. When the types of the plurality of light-emitting pixels are the same, one pixel region 133 corresponds to one light-emitting color; When the types of the plurality of light-emitting pixels are different, (for example, if one pixel region 133 comprises a red light-emitting pixel, a green light-emitting pixel, and a blue light-emitting pixel, one pixel region 133 comprises a plurality of light-emitting colors), the light-emitting colors of one pixel region 133 can be individually adjusted to meet different display requirements of the display panel 100 through mutual cooperation among a plurality of different light-emitting pixels.

The lap portion 1121 is disposed between at least two adjacent said pixel regions 133, that is, the lap portion 1121 is located between adjacent pixel regions 133. With this structural design, setting of the lap portion 1121 will not affect light-emitting region of the display panel 100, effective electrical connection between the cathode layer 170 and the overlapping portion 1121 is ensured, resistance voltage drops at different positions of the display area of the display panel 100 is reduced, and meanwhile, normal display of the display panel 100 can be ensured.

Optionally, the lap layer 112 comprises a plurality of lap portions 1121. By setting the plurality of lap portions 1121, internal resistance voltage drops at various positions in the display area of the display panel 100 can be adjusted, so as to further balance internal resistance voltage drops at each position in the display area and improve display effect of the display panel 100.

The plurality of lap portions 1121 are disposed between adjacent pixel regions 133, so as to avoid influence of the lap portions 1121 on light-emitting effect of the light-emitting layer 150 of the pixel region 133. Specific distribution positions of the plurality of lap portions 1121 can be adjusted according to actual internal resistance voltage drops in the display area of the display panel 100 and difference of the internal resistance voltage drops among different positions, and it is only necessary to ensure that setting of the plurality of lap portions 1121 can effectively improve display effect of the display panel 100.

Since the lap portion 1121 is located between two adjacent pixel regions 133, and the plurality of pixel regions 133 are distributed in an array, an integer multiple of pixel regions 133 are disposed between two adjacent lap portions 1121, and the spacing between two adjacent lap portions 1121 can be an integer multiple of a width of the pixel region 133 in a layout direction of the plurality of lap portions 1121. As shown in FIG. 11, three pixel regions 133 are disposed between two adjacent lap portions 1121, and each pixel region 133 corresponds to one light-emitting sub-pixel. In the process of manufacturing the display panel, the width of each light-emitting sub-pixel in a layout direction of the plurality of lap portions 1121 can be set to be the same, and the spacing between two adjacent lap portions 1121 is three times the corresponding width of one pixel region 133.

In some embodiments, the light-emitting sub-pixel corresponding to the pixel region 133 comprise a red pixel, a green pixel, and a blue pixel, and three adjacent light-emitting sub-pixels of different colors are used as one light-emitting pixel as a whole. The lap portion 1121 is located between two adjacent light-emitting pixels, so that an integer multiple of light-emitting pixels are disposed between two adjacent lap portions 1121, and spacing between two adjacent lap portions 1121 can be an integer multiple of a width of the light-emitting pixels in a layout direction of the plurality of lap portions 1121. As shown in FIG. 11, if one light-emitting pixel is disposed between two adjacent lap portions 1121, spacing between two adjacent lap portions 1121 is a width corresponding to one light-emitting pixel.

Therefore, when lap portions 1121 are disposed in the array substrate 110, spacing between two lap portions 1121 can be designed according to size of an integer number of pixel regions 133, so as to ensure that subsequent electrical connection between the cathode layer 170 and the lap portion 1121 does not affect light-emitting effect of the corresponding pixel region 133.

According to size of the pixel region 133 and layout direction of actual internal resistance pressure drops at different positions of the display area, spacing between two adjacent lap portions 1121 in embodiments of the present disclosure is greater than or equal to 10 mm and less than or equal to 100 mm. During actual manufacturing process, the spacing can be set as 10 mm, 20 mm, 50 mm, 80 mm, or 100 mm, etc., it is only necessary to ensure that setting of the lap portions 1121 is conducive to balancing the internal resistance pressure drop at each position of the display area, and improving display uniformity of the display panel 100 without affecting normal light-emitting of the pixel region 133. Specific spacing value can be adjusted according to actual requirements, which is not specially limited herein.

Optionally, as shown in FIGS. 1 and 2, the display panel 100 further comprises a light-emitting layer 150 and an electron transport layer 160. The light-emitting layer 150 is disposed on the anode layer 120, the light-emitting layer 150 is located within the pixel opening 132, and the electron transport layer 160 is located on the light-emitting layer 150 and the pixel definition layer 130, so that the light-emitting layer 150 and the electron transport layer 160 are located between the anode layer 120 and the cathode layer 170, and the light-emitting layer 150 and the electron transport layer 160 together form a light-emitting functional layer.

It should be noted that a hole injection layer and a hole transport layer are further disposed between the light-emitting layer 150 and the anode layer 120, and an electron injection layer is further disposed between the electron transport layer 160 and the cathode layer 170. Setting of the hole injection layer, the hole transport layer, the electron transport layer 160 and the electron injection layer can further improve light-emitting effect of the light-emitting layer 150 to improve display effect of the display panel 100.

Optionally, a height of one side of the light-emitting layer 150 away from the array substrate 110 relative to the array substrate 110 is less than a height of one side of the fence layer 140 away from the array substrate 110 relative to the array substrate 110. That is, after the pixel opening 132 is formed on the pixel definition layer 130 to expose part of the anode layer 120, a layer of light-emitting layer 150 is printed on the anode layer 120 in a printing manner. To avoid interference of the light-emitting layer 150 in adjacent pixel openings 132, the whole light-emitting layer 150 is located in the pixel opening 132 during printing, so that a height of the light-emitting layer 150 is less than or equal to a height of the pixel definition layer 130, that is, the height of the light-emitting layer 150 is less than the height of the fence layer 140.

In addition, setting the height of the light-emitting layer 150 to be less than the height of the fence layer 140 can also make a height of a part of the electron transport layer 160 corresponding to the light-emitting layer 150 less than a height of a part of the electron transport layer 160 corresponding to the fence layer 140, thereby ensuring that the fence layer 140 can support the shielding structure, so as to prevent the shielding structure from scratching the electron transport layer 160, thus improving display effect of the display panel 100.

As shown in FIGS. 1 and 2, the display panel 100 further comprises an encapsulation layer 180. The encapsulation layer 180 is disposed on the cathode layer 170, and the encapsulation layer 180 fills the first opening 121 and the second opening 131 to encapsulate the cathode layer 170 and film layers below the cathode layer 170, so as to prevent moisture or oxygen in the air from entering into the display panel 100 and causing erosion to related functional film layers, thereby ensuring display effect of the display panel 100 and prolonging service life of the display panel 100.

Secondly, embodiments of the present disclosure further provide a display device, which comprises a display panel. For specific structure of the display panel, please refer to the above embodiments. Since the display device adopts all the technical solutions of all the above embodiments, it has at least all the beneficial effects brought about by the technical solutions of the above embodiments. Details are not described repeatedly.

Figure 3:
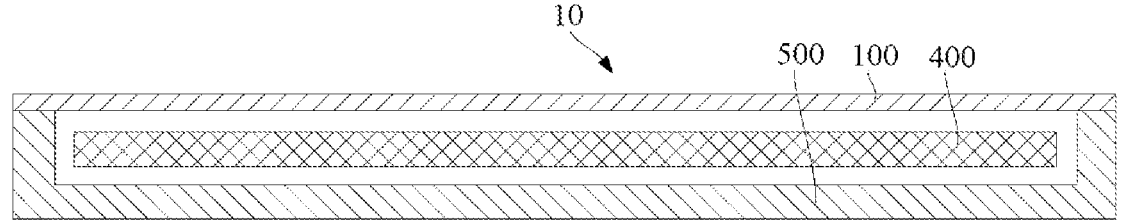
FIG. 3 is a schematic structural diagram of a display device according to an embodiment of the present disclosure.

FIG. 3 is a schematic structural diagram of a display device according to an embodiment of the present disclosure. As shown in FIG. 3, the display device 10 comprises a display panel 100, a control circuit 400, and a housing 500. The housing 500 is connected to the display panel 100 to support and fix the display panel 100. The control circuit 400 is disposed in the housing 500, and the control circuit 400 is electrically connected to the display panel 100 to control the display panel 100 to display an image.

The display panel 100 may be fixed to the housing 500 and formed integrally with the housing 500, and the display panel 100 and the housing 500 form a closed space for containing the control circuit 400. The control circuit 400 may be a motherboard of the display device 10, and meanwhile, one or more functional components such as a battery, an antenna structure, a microphone, a speaker, a headphone interface, a universal serial bus interface, a camera, a distance sensor, an ambient light sensor, a receiver, and a processor can be integrated on the control circuit 400, so that the display device 10 can adapt to various application fields.

It should be noted that the display device 10 is not limited to the above contents, and may further comprises other components, such as a camera, an antenna structure, a fingerprint unlocking module, etc., to expand its scope of use, which is not limited herein. The display device 10 in embodiments of the present disclosure has a wide range of applications, including a television, a computer, and flexible display device and lighting device such as a foldable or flexible display screen, all of which are within application field of the display device 10 in embodiments of the present disclosure.

Finally, embodiments of the present disclosure further provide a method for manufacturing a display panel. As shown in FIG. 4, the method for manufacturing a display panel comprises steps of:

S100, providing an array substrate 110, wherein the array substrate 110 comprises an underlayer substrate 111 and a lap layer 112 that are sequentially disposed, and the lap layer 112 comprises a lap portion 1121.

The array substrate 110 is disposed with a thin film transistor layer. When the array substrate 110 is manufactured, the lap layer 112 can be disposed in the same layer as a metal layer in the thin film transistor layer, such as a gate layer or a source/drain layer, that is, when a gate layer or a source/drain layer is patterned to form a gate or a source/drain, the lap portion 1121 is patterned at the same time to reduce the number of masking in the manufacturing process of the array substrate 110, thus process flow is simplified.

As shown in FIG. 5, when the lap layer 112 is disposed in the array substrate 110, in order to ensure an effective connection between subsequent film layers and the lap portion 1121, it is necessary to punch holes on the film layers above the lap portion 1121, so as to expose part of the lap portion 1121 for electrical connection with subsequent film layers. When the lap portion 1121 is formed by patterning, the lap portion 1121 can be distributed in the array substrate 110 in a strip array, and positions of the holes can be adjusted according to actual design requirements.

S200, forming an anode layer 120 on the array substrate 110, and forming a first opening 121 on the anode layer 120 at a position corresponding to the lap portion 1121 to expose lap portion 1121.

As shown in FIG. 6, after manufacturing of the array substrate 110 is completed, an anode layer 120 is first deposited on the array substrate 110, and a first opening 121 is formed on the anode layer 120 at a position corresponding to the lap portion 1121, so that the first opening 121 exposes the lap portion 1121, which is convenient for subsequent film layers to be electrically connected to the lap portion 1121 through the first opening 121.

S300, forming a pixel definition layer 130 on the array substrate 110 and the anode layer 120, and forming a second opening 131 on the pixel definition layer 130 at a position corresponding to the first opening 121.

As shown in FIG. 6, after manufacturing of the anode layer 120 is completed, a pixel definition layer 130 is deposited on the array substrate 110 and the anode layer 120, and a second opening 131 is formed on the pixel definition layer 130 at a position corresponding to the first opening 121, so that the second opening 131 communicates with the first opening 121 and exposes the lap portion 1121, which is convenient for subsequent film layers to be electrically connected to the lap portion 1121 through the second opening 131 and the first opening 121.

S400, forming a fence layer 140 on the pixel definition layer 130, and the fence layer 140 comprises a fence portion 141, so that the fence portion 141 extends along an edge of the second opening 131.

As shown in FIGS. 7 and 8, after manufacturing of the pixel definition layer 130 is completed, a fence layer 140 is formed on the pixel definition layer 130, and the fence layer 140 is etched to form a fence portion 141, and the fence portion 141 extends along an edge of the second opening 131. The fence portion 141 formed after etching is convexly disposed on the pixel definition layer 130, and extends along an edge of the second opening 131 to form a tendency to surround the second opening 131.

S500, depositing a cathode layer 170 on the pixel definition layer 130 and the fence layer 140 so that the cathode layer 170 is electrically connected to the lap portion 1121 through the first opening 121 and the second opening 131.

As shown in FIG. 9, after manufacturings of the pixel definition layer 130 and the fence layer 140 are completed, a cathode layer 170 needs to be deposited on the pixel definition layer 130 and the fence layer 140. The cathode layer 170 and the anode layer 120 are connected to an external circuit through metal traces on the display panel 100 to realize on and off of a circuit, so as to realize display regulation of the display panel 100

The cathode layer 170 is electrically connected to the lap portion 1121 through the first opening 121 and the second opening 131. When the display panel 100 is in operation, due to influence of an internal resistances of the cathode layer 170 and the metal traces, there are internal resistance voltage drops at different positions in display area of the display panel 100, which may easily cause uneven display of the display panel 100 as a whole. A resistor with a small resistance value will be formed at a position of the cathode layer 170 corresponding to the lap portion 1121 by electrically connecting the cathode layer 170 and the lap portion 1121 in parallel, so as to achieve the purpose of reducing internal resistance voltage drops in corresponding area of the display panel 100, thereby improving the overall display effect of the display panel 100.

Optionally, as shown in FIG. 10, step S500 in embodiments of the present disclosure mainly comprises the following contents:

S510, evaporating an electron transport layer 160 on the pixel definition layer 130 and the fence layer 140.

After the fence portion 141 is formed on an edge of the pixel definition layer 130 corresponding to the second opening 131, an electron transport layer 160 needs to be formed on the pixel definition layer 130 and the fence layer 140. The process mainly comprises the following contents:

As shown in FIGS. 7 and 11, firstly, forming a plurality of pixel openings 132 on the pixel definition layer 130 so as to expose part of the anode layer 120. Then, printing a light-emitting layer 150 on the anode layer 120 so that the light-emitting layer 150 is located in the pixel opening 132. Followed by evaporating an electron transport layer 160 on the light-emitting layer 150, the pixel definition layer 130, and the fence layer 140.

The step of forming a plurality of pixel openings 132 on the pixel definition layer 130 and the step of forming a second opening 131 on the pixel definition layer 130 at a position corresponding to the first opening 121 in step 200 can be performed synchronously. That is, at the same time of subjecting the pixel definition layer 130 to etching, the second opening 131 and the pixel opening 132 are formed on the pixel definition layer 130, so as to save the number of masking in the manufacturing process of the array substrate 110, thus process flow is simplified.

In embodiments of the present disclosure, when the light-emitting layer 150 is formed on the anode layer 120, a printing method is adopted, so that the light-emitting layer 150 and the exposed anode layer 120 can be brought into full contact with each other, and meanwhile, the light-emitting layer 150 can be stably located in the pixel opening 132 of the pixel definition layer 130, thus avoiding mutual interference of the light-emitting layers 150 in adjacent pixel openings 132, and affecting light-emitting effect of the display panel 100. In addition, the light-emitting layer 150 formed by printing is located in the pixel opening 132, so that a height of one side of the light-emitting layer 150 away from the array substrate 110 relative to the array substrate 110 is less than a height of one side of the fence layer 140 away from the array substrate 110 relative to the array substrate 110, thereby ensuring that the fence portion 141 can play a supporting role.

After manufacturing of the light-emitting layer 150 is completed, an electron transport layer 160 is evaporated on the light-emitting layer 150, the pixel definition layer 130, and the fence layer 140, which can increase electron mobility among the anode layer 120, the light-emitting layer 150, and the electron transport layer 160, thereby improving light-emitting effect of the light-emitting layer 150. In addition, forming the electron transport layer 160 by evaporation can improve uniformity of the electron transport layer 160, thereby ensuring uniformity of electron mobility at different positions on the electron transport layer 160, and further improving light-emitting effect of the light-emitting layer 150.

S520, placing a first mask 200 on the electron transport layer 160 so that a first hole 210 on the first mask 200 corresponds to the second opening 131, and etching the electron transport layer 160 to expose the lap portion 1121.

As shown in FIG. 12, when the electron transport layer 160 is formed by evaporation, the electron transport layer 160 will pass through the second opening 131 and the first opening 121 and cover the exposed lap portion 1121. In order to expose thelap portion 1121, the first mask 200 with holes is used as a shielding structure in embodiments of the present disclosure. When the first mask 200 is placed on the electron transport layer 160, the fence portion 141 can support the first mask 200.

A first hole 210 is formed in the first mask 200. When the first mask 200 is placed, the first hole 210 in the first mask 200 corresponds to the second opening 131 in the pixel definition layer 130, and a diameter of the first hole 210 should be smaller than an outer diameter of the fence portion 141, so as to ensure that the first mask 200 can be stably supported on the fence portion 141.

After the first mask 200 is placed, when the electron transport layer 160 is etched, a main reaction gas of etching gas is an oxidizing gas such as nitrous oxide or oxygen, and a dilution gas is an inert gas such as nitrogen, helium, or argon. The etching gas is changed into plasma by electrifying a chamber of a plasma-enhanced chemical vapor deposition equipment, so that the oxidizing gas such as nitrous oxide or oxygen reacts with an evaporation layer covering the lap layer 112 in the second opening 131 and the first opening 121 to form gaseous reactants, which are directly taken out by vacuum pumping, thereby exposing the lap layer 112.

A proportion of each component of the etching gas can be adjusted according to takt time and etching uniformity, which is not specially limited herein. By adopting this etching method, climbing positions around the exposed lap portion 1121 can be changed slowly without obvious segment difference, which is beneficial to manufacture of subsequent film layers, and lap effect between subsequent film layers and the lap portion 1121 can be improved. It is also beneficial to encapsulation of the display panel 100, and stable application of the display panel 100 can be ensured. In addition, since the fence portion 141 surrounds an edge of the second opening 131, it is possible to effectively prevent the etching gas from entering areas except for the fence portion 141, thereby protecting areas other than the fence portion 141 and avoiding affecting display effect of the display panel 100.

It should be noted that setting manner of the first hole 210 on the first mask 200 can be consistent with the setting manner of the lap portion 1121, that is, spacing of two adjacent first openings 210 on the first mask 200 is designed according to size of an integer number of pixel regions 133, so as to ensure that position of the first hole 210 corresponds to position of the exposed lap portion 1121 when the first mask 200 is supported on the fence portion 141, thereby ensuring effective electrical connection between subsequent film layers and the lap portion 1121.

The number of the first holes 210 is less than or equal to a number of the lap portions 1121. During a manufacturing process of the display panel 100, the lap portions 1121 can be disposed between any two adjacent pixel regions 133. However, holes are only punched on film layers above only part of the lap portions 1121, that is, not all the lap portions 1121 are exposed. The numbers and positions of the first holes 210 correspond to the numbers and positions of the exposed lap portions 1121, respectively.

This structural design enables the punching position above the lap portion 1121 to be adjusted at any time according to actual internal resistance voltage drops at different positions in the display area of the display panel 100, and the first hole 210 on the first mask 200 to be adjusted following the punching position above the lap portion 1121, so that connection mode between subsequent film layers and the lap portion 1121 is more flexible, which can not only effectively balance the internal resistance pressure drops at different positions of the display panel 100, but also avoid unnecessary film layer etching, thus improving display effect of the display panel 100.

S530, removing the first mask 200.

S540, depositing a cathode layer 170 on the electron transport layer 160.

After manufacturing of the electron transport layer is completed, the first mask 200 is removed, and then a cathode layer 170 is deposited on the electron transport layer 160, and the cathode layer 170 is electrically connected to the lap portion 1121 through the first hole 121 and the second hole 131, so that a resistor with a small resistance value will be formed at a position of the cathode layer 170 corresponding to the lap portion 1121 by electrically connecting the cathode layer 170 and the lap portion 1121 in parallel, so as to achieve the purpose of reducing internal resistance voltage drops in corresponding area of the display panel 100, thereby improving the overall display effect of the display panel 100.

It should be noted that the cathode layer 170 is one of the most important reflective layers in the display panel 100, and reflectivity of the display panel 100 can be significantly reduced by reducing area of the cathode layer 170, thereby improving display effect of the display panel 100. Therefore, after the cathode layer 170 is formed, the cathode layer 170 can be patterned, so that the cathode layers 170 in areas corresponding to the pixel region 133, a lap region lapped with the lap portion 1121, and a channel connecting the lap region with adjacent pixel region 133 are remained, and the cathode layers 170 in other areas are removed, thereby achieving a purpose of reducing the overall area of the cathode layer 170 and improving display effect of the display panel 100.

Figure 13:
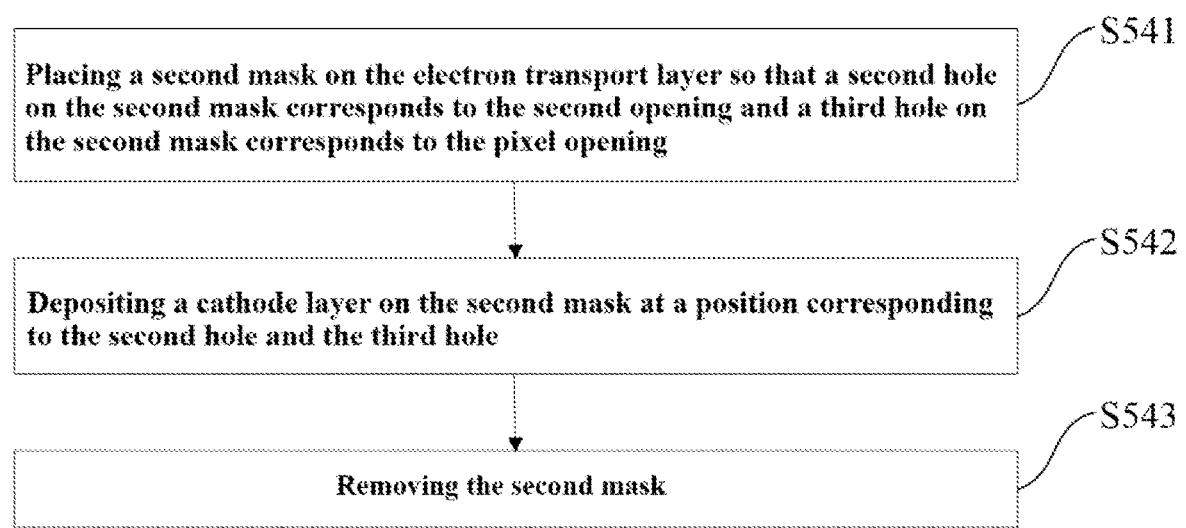
FIG. 13 is a flowchart of step S540 in FIG. 10 according to an embodiment of the present disclosure.

Optionally, as shown in FIG. 13, step S540 in embodiments of the present disclosure mainly comprises the following contents:

S541, placing a second mask 300 on the electron transport layer 160 so that a second hole 310 on the second mask 300 corresponds to the second opening 131 and a third hole 320 on the second mask 300 corresponds to the pixel opening 132.

Figure 14:
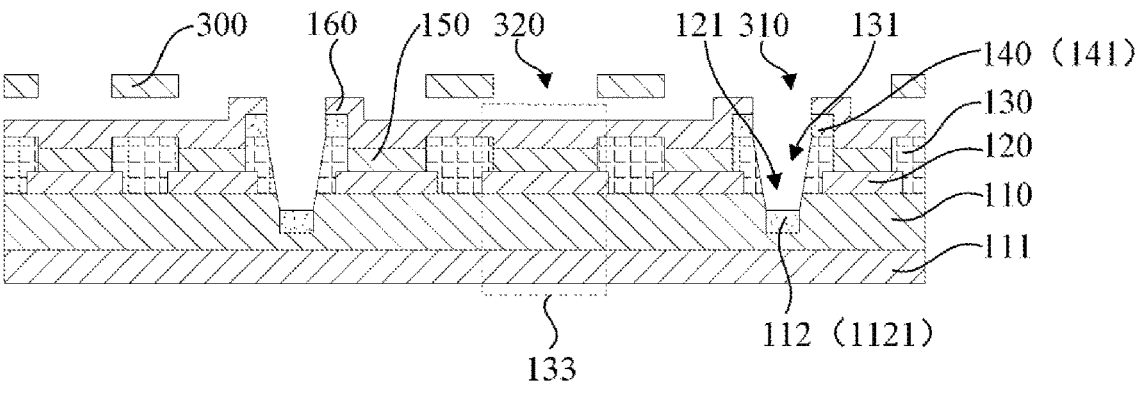
FIG. 14 is a schematic structural diagram of step S541 in FIG. 13 according to an embodiment of the present disclosure.

As shown in FIG. 14, since the cathode layers 170 in areas corresponding to the pixel region 133, a lap region lapped with the lap portion 1121 and a channel connecting the lap region with adjacent pixel region 133 are remained When the second hole 310 and the third hole 320 are formed on the second mask 300, the second hole 310 corresponds to the second opening 131, that is, the second hole 310 corresponds to the exposed lap portion 1121; and the third hole 320 corresponds to the pixel opening 132, that is, the third hole 320 corresponds to the pixel region 133. In order to ensure that the cathode layer 170 can communicate with adjacent pixels in the lap region when the cathode layer 170 is subsequently formed, the second hole 310 on the second mask 300 and third hole 320 adjacent to thereof need to communicate with each other to facilitate manufacturing of subsequent cathode layer 170.

S542, depositing a cathode layer 170 on the second mask 300 at a position corresponding to the second hole 310 and the third hole 320.

Figure 15:
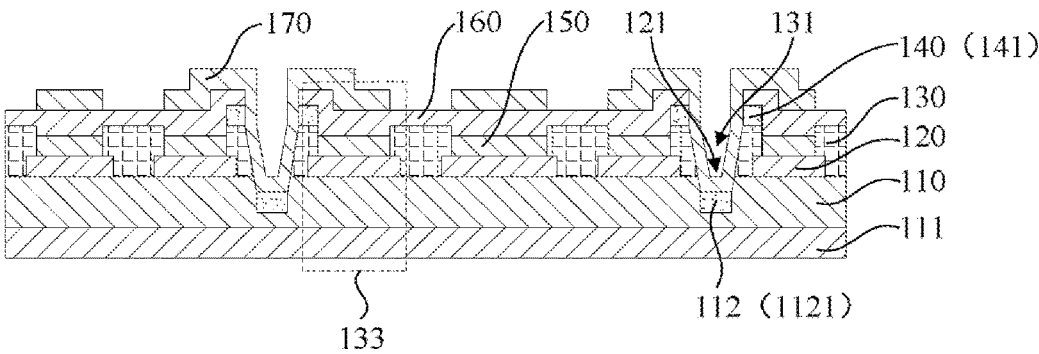
FIG. 15 is a schematic structural diagram of step S543 in FIG. 13 according to an embodiment of the present disclosure.
Figure 16:
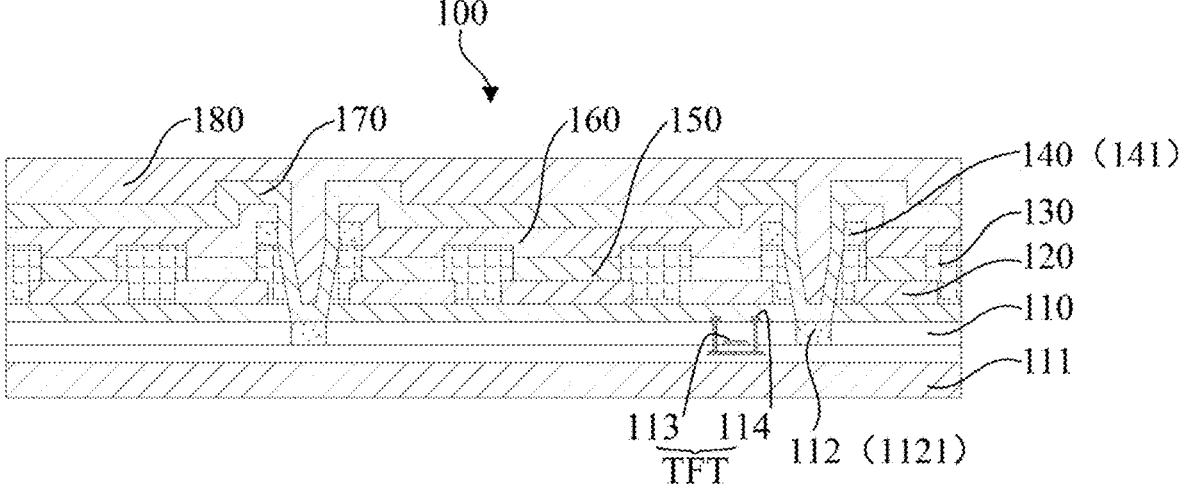
FIG. 16 is a schematic structural diagram of a display panel according to an embodiment of the present application, wherein the lap layer and the gate layer are disposed in the same layer.
Figure 17:
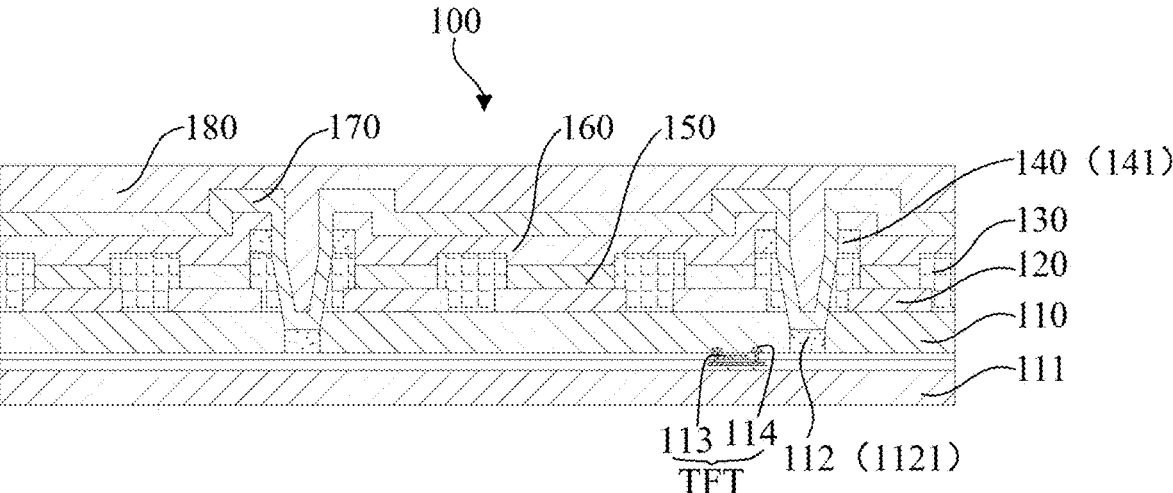
FIG. 17 is a schematic structural diagram of a display panel according to an embodiment of the present application, wherein the lap layer and the source/drain layer are disposed in the same layer.

As shown in FIG. 15, after the second mask 300 is placed, all areas except for those corresponding to the second hole 310 and the third hole 320 are shielded. When depositing the cathode layer 170, the cathode layer 170 is mainly located at positions of the second mask 300 corresponding to the second hole 310 and the third hole 320. This deposition method enables deposition and patterning of the cathode layer 170 to be completed at the same time, thereby saving one masking and simplifying manufacturing process of the display panel 100. Meanwhile, areas of the cathode layer 170 formed by this deposition method are effectively reduced, thereby achieving purpose of reducing the overall area of the cathode layer 170 and improving display effect of the display panel 100.

S543, removing the second mask. As shown in FIG. 15, the second mask 300 can be removed after manufacturing of the cathode layer 170 is completed, and the cathode layer 170 thus obtained is a patterned cathode layer 170.

Optionally, as shown in FIGS. 1 and 2, the method for manufacturing the display panel 100 in embodiments of the present disclosure further comprises forming an encapsulation layer 180 on the cathode layer 170 so that the encapsulation layer 180 fills the first opening 121 and the second opening 131 to encapsulate the cathode layer 170 and film layers below the cathode layer 170, so as to prevent moisture or oxygen in the air from entering into the display panel 100 and causing erosion to related functional film layers, thereby ensuring display effect of the display panel 100 and prolonging service life of the display panel 100.

It should be noted that, by adopting the above etching method, climbing positions around the exposed lap portion 1121 can be changed slowly without obvious segment difference, so that the cathode layers 170 formed on side walls of the first opening 121 and the second opening 131 also has a slow and smooth transition without obvious segment difference, which is conducive to improving lap effect between the cathode layer 170 and the lap portion 1121. Therefore, during encapsulation process, the encapsulation layer 180 will not form obvious segment difference on side walls of the first opening 121 and the second opening 131, which is beneficial to improve encapsulation effect of the encapsulation layer 180, thus reducing risk of breakage of the encapsulation layer 180 during use of the display panel 100, and prolonging service life of the display panel 100.

A display panel, a display device and a method for manufacturing the display panel provided in embodiments of the present disclosure are described in detail above. The principles and embodiments of the present disclosure are described by using specific examples herein. Descriptions of the above embodiments are merely intended to help understand the technical solutions and core ideas of the present disclosure. A person skilled in the art shall understand that it is still possible to modify the technical solutions described in the above embodiments, or equivalently substitute some of the technical features thereof. However, these modifications or substitutions do not make the essence of the corresponding technical solutions depart from scopes of the technical solutions of each embodiment of the present disclosure.

What is claimed is:

1. A display panel, comprising:
an array substrate comprising an underlayer substrate and a lap layer that are sequentially disposed, wherein the lap layer comprises a lap portion;
an anode layer disposed on the array substrate, wherein the anode layer is provided with a first opening at a position corresponding to the lap portion, and the first opening penetrates through the anode layer to expose the lap portion;
a pixel definition layer disposed on the array substrate and the anode layer, wherein the pixel definition layer is provided with a second opening at a position corresponding to the first opening, and the second opening penetrates through the pixel definition layer;
a fence layer disposed on the pixel definition layer, and the fence layer comprises a fence portion extending along an edge of the second opening; and
a cathode layer disposed on the pixel definition layer and the fence layer, and the cathode layer is electrically connected with the lap portion through the first opening and the second opening;
wherein the array substrate is provided with a groove, the lap portion is disposed in the groove, and the anode layer is disposed above the lap layer.

2. The display panel according to claim 1, wherein the fence portion extends in an annular shape along an edge of the second opening.

3. The display panel according to claim 2, wherein the fence portion has a circular structure; the fence portion has an inner diameter of greater than or equal to 6 microns and less than or equal to 12 microns; and a difference between an outer diameter and the inner diameter of the fence portion is greater than or equal to 7 microns and less than or equal to 12 microns.

4. The display panel according to claim 1, wherein the fence portion has a thickness of greater than or equal to 0.8 microns and less than or equal to 2 microns.

5. The display panel according to claim 1, wherein the display panel comprises a plurality of pixel regions, a pixel opening is formed on the pixel definition layer at a position corresponding to the pixel regions, and the pixel opening exposes part of the anode layer; and the lap portion is disposed between at least two adjacent said pixel regions.

6. The display panel according to claim 5, wherein the lap layer comprises a plurality of the lap portions; a spacing between two adjacent said lap portions is greater than or equal to 10 mm and less than or equal to 100 mm.

7. The display panel according to claim 6, wherein the spacing between two adjacent said lap portions is an integer multiple of a width of the pixel region in a layout direction of the plurality of lap portions.

8. The display panel according to claim 1, wherein a material of the lap layer comprises copper, aluminum, silver, or a metal alloy.

9. The display panel according to claim 1, wherein the array substrate comprises a thin film transistor layer comprising a gate layer and a source/drain layer;

the lap layer and the gate layer are disposed in the same layer; or the lap layer and the source/drain layer are disposed in the same layer.

10. The display panel according to claim 5, wherein the display panel further comprises a light-emitting layer and an electron transport layer, the light-emitting layer is disposed on the anode layer, the light-emitting layer is located within the pixel opening, and the electron transport layer is located on the light-emitting layer and the pixel definition layer.

11. The display panel according to claim 10, wherein a height of one side of the light-emitting layer facing away from the array substrate relative to the array substrate is less than a height of one side of the fence layer facing away from the array substrate relative to the array substrate.

12. The display panel according to claim 1, wherein the display panel further comprises an encapsulation layer disposed on the cathode layer, and the encapsulation layer fills the first opening and the second opening.

13. A display device, comprising:

a display panel;

a housing connected to the display panel; and a control circuit disposed in the housing, and the control circuit is electrically connected to the display panel;

wherein the display panel comprises:

an array substrate comprising an underlayer substrate and a lap layer that are sequentially disposed, wherein the lap layer comprises a lap portion;

an anode layer disposed on the array substrate, wherein the anode layer is provided with a first opening at a position corresponding to the lap portion, and the first opening penetrates through the anode layer to expose the lap portion;

a pixel definition layer disposed on the array substrate and the anode layer, wherein the pixel definition layer is provided with a second opening at a position corresponding to the first opening, and the second opening penetrates through the pixel definition layer;

a fence layer disposed on the pixel definition layer, and the fence layer comprises a fence portion extending along an edge of the second opening; and a cathode layer disposed on the pixel definition layer and the fence layer, and the cathode layer is electrically connected with the lap portion through the first opening and the second opening;

wherein the array substrate is provided with a groove, the lap portion is disposed in the groove, and the anode layer is disposed above the lap layer.

14. A method for manufacturing a display panel, comprising steps of:

providing an array substrate, the array substrate comprises an underlayer substrate and a lap layer that are sequentially disposed, and the lap layer comprises a lap portion;

forming an anode layer on the array substrate, and forming a first opening penetrating through the anode layer at a position corresponding to the lap portion to expose lap portion;

forming a pixel definition layer on the array substrate and the anode layer, and forming a second opening penetrating through the pixel definition layer at a position corresponding to the first opening;

forming a fence layer on the pixel definition layer, and the fence layer comprises a fence portion so that the fence portion extends along an edge of the second opening;

depositing a cathode layer on the pixel definition layer and the fence layer so that the cathode layer is electrically connected to the lap portion through the first opening and the second opening;

wherein the array substrate is provided with a groove, the lap portion is disposed in the groove, and in a direction of film thickness, a thickness of the lap portion is less than a depth of the groove; the anode layer is disposed above the lap layer.

15. The method according to claim 14, wherein said depositing a cathode layer on the pixel definition layer and the fence layer comprises steps of:

evaporating an electron transport layer on the pixel definition layer and the fence layer;

placing a first mask plate on the electron transport layer so that a first hole on the first mask plate corresponds to the second opening, and etching the electron transport layer to expose the lap portion;

removing the first mask plate; and depositing a cathode layer on the electron transport layer.

16. The method according to claim 15, wherein a number of the first holes is less than or equal to a number of the lap portions.

17. The method according to claim 15, wherein a diameter of the first hole is smaller than an outer diameter of the fence portion.

18. The method according to claim 15, wherein said evaporating an electron transport layer on the pixel definition layer and the fence layer comprises steps of:

forming a plurality of pixel openings on the pixel definition layer so as to expose part of the anode layer;

printing a light-emitting layer on the anode layer so that the light-emitting layer is located in the pixel opening; and depositing an electron transport layer on the light-emitting layer, the pixel definition layer, and the fence layer.

19. The method according to claim 17, wherein said depositing a cathode layer on the electron transport layer comprises steps as follows:

placing a second mask plate on the electron transport layer so that a second hole on the second mask plate corresponds to the second opening and a third hole on the second mask plate corresponds to the pixel opening;

depositing a cathode layer on the second mask plate at a position corresponding to the second hole and the third hole; and removing the second mask.

20. The method according to claim 14, wherein the method further comprises a step of forming an encapsulation layer on the cathode layer so that the encapsulation layer fills the first opening and the second opening.

* * * * *